(12) United States Patent
Lee et al.

(10) Patent No.: US 12,193,271 B2
(45) Date of Patent: Jan. 7, 2025

(54) DISPLAY APPARATUS AND METHOD OF MANUFACTURING THE SAME

(71) Applicant: Samsung Display Co., Ltd., Yongin-Si (KR)

(72) Inventors: Dongmin Lee, Yongin-si (KR); Jaewoo Jeong, Yongin-si (KR); Janghyun Kim, Yongin-si (KR); Jongoh Seo, Yongin-si (KR); Byungsoo So, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 302 days.

(21) Appl. No.: 17/715,553

(22) Filed: Apr. 7, 2022

(65) Prior Publication Data

US 2023/0128109 A1 Apr. 27, 2023

(30) Foreign Application Priority Data

Oct. 27, 2021 (KR) .................. 10-2021-0144967

(51) Int. Cl.
*H10K 59/121* (2023.01)
*H10K 71/00* (2023.01)
*H01L 27/12* (2006.01)
*H01L 29/66* (2006.01)
*H01L 29/786* (2006.01)
*H10K 59/12* (2023.01)

(52) U.S. Cl.
CPC ......... *H10K 59/1213* (2023.02); *H10K 71/00* (2023.02); *H01L 27/1222* (2013.01); *H01L 27/1274* (2013.01); *H01L 29/66757* (2013.01); *H01L 29/78675* (2013.01); *H10K 59/1201* (2023.02)

(58) Field of Classification Search
CPC .................. H10K 59/1213; H10K 71/00
See application file for complete search history.

(56) References Cited

U.S. PATENT DOCUMENTS

| | | | |
|---|---|---|---|
| 6,162,704 A | 12/2000 | Yamazaki et al. | |
| 6,500,720 B2 | 12/2002 | Kunikiyo | |
| 6,750,086 B2 | 6/2004 | Jinno et al. | |
| 6,921,685 B2 | 7/2005 | Okumura | |
| 7,432,141 B2 * | 10/2008 | Gu | H01L 21/84 257/E29.082 |
| 7,696,059 B2 | 4/2010 | Akiyama et al. | |
| 8,324,086 B2 | 12/2012 | Shimomura et al. | |
| 10,325,928 B2 | 6/2019 | Lee | |

FOREIGN PATENT DOCUMENTS

| | | |
|---|---|---|
| KR | 10-0281558 B1 | 2/2001 |
| KR | 10-0440840 B1 | 7/2004 |
| KR | 10-0525527 B1 | 11/2005 |
| KR | 10-0538892 B1 | 3/2006 |
| KR | 10-0676330 B1 | 8/2007 |
| KR | 10-1384845 B1 | 4/2014 |
| KR | 10-1563136 B1 | 10/2015 |
| KR | 10-2017-0136740 A | 12/2017 |

* cited by examiner

*Primary Examiner* — Douglas M Menz
(74) *Attorney, Agent, or Firm* — Innovation Counsel LLP

(57) ABSTRACT

A display apparatus includes a substrate, a gate electrode overlapping the substrate, and a semiconductor layer positioned between the substrate and the gate electrode. The semiconductor layer includes a first layer and a second layer positioned between the first layer and the gate electrode. A hydrogen content of the first layer is greater than a hydrogen content of the second layer.

13 Claims, 6 Drawing Sheets

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2021-0144967 filed on Oct. 27, 2021 in the Korean Intellectual Property Office; the Korean Patent Application is incorporated by reference.

BACKGROUND

1. Field

The technical field relates to a display apparatus and a method for manufacturing the display apparatus.

2. Description of the Related Art

A display apparatus may include pixels for display images according to input signals. In general, a display apparatus (such as an organic light-emitting display apparatus) includes thin-film transistors for driving pixels, and each of the thin-film transistors may include a semiconductor layer.

SUMMARY

One or more embodiments may be related a display apparatus that includes semiconductor layers with minimum defects. One or more embodiments may be related to a method for manufacturing the display apparatus. By controlling a/the hydrogen content in/of an amorphous silicon layer, the method may prevent or minimize the occurrence of a film breakage defect during a process of crystallizing an amorphous silicon layer into a polycrystalline silicon layer.

According to one or more embodiments, a display apparatus includes a substrate, a gate electrode arranged on the substrate, and a semiconductor layer between the substrate and the gate electrode, the semiconductor layer including a lower portion adjacent to the substrate and an upper portion adjacent to the gate electrode, wherein a hydrogen content in the lower portion is greater than a hydrogen content in the upper portion.

The semiconductor layer may include polycrystalline silicon.

A grain interface of the polycrystalline silicon may be formed in a thickness direction of the semiconductor layer.

The semiconductor layer may have a thickness of about 450 angstroms (Å) to about 500 Å.

The thickness of the lower portion may be about 150 Å to about 170 Å.

The display apparatus may further include a buffer layer arranged between the substrate and the semiconductor layer.

The display apparatus may further include a light-emitting device arranged on the gate electrode and including a first electrode, an emission layer, and a second electrode sequentially stacked.

According to one or more embodiments, a method of manufacturing a display apparatus includes forming an amorphous silicon layer on a substrate, heat-treating the amorphous silicon layer, doping the heat-treated amorphous silicon layer with hydrogen, and crystallizing the hydrogen-doped amorphous silicon layer into a polycrystalline silicon layer by irradiating a laser, wherein the hydrogen-doped amorphous silicon layer includes a first lower portion positioned on the substrate and a first upper portion positioned on the first lower portion, wherein a hydrogen content in the first lower portion is greater than a hydrogen content in the first upper portion.

A deposition temperature for depositing the amorphous silicon layer in the forming of the amorphous silicon layer on the substrate may be about 390° C. to about 490° C.

A heat treatment temperature in the heat-treating may be about 440° C. to about 500° C.

The heat-treating may be performed for about 300 seconds to about 360 seconds.

A hydrogen content in the amorphous silicon layer after the heat-treating may be 3 at % or less.

A dose amount of hydrogen in the doping with hydrogen may be about $1\times10^{15}$ atom/cm$^3$ to about $1\times10^{17}$ atom/cm$^3$.

An acceleration voltage in the doping with hydrogen may be about 3 keV to about 10 keV.

The amorphous silicon layer may have a thickness of about 450 Å to about 500 Å.

The thickness of the first lower portion may be about 150 Å to about 170 Å.

The method may further include forming a semiconductor layer by patterning the polycrystalline silicon layer.

A grain interface of polycrystalline silicon included in the semiconductor layer may be formed in a thickness direction of the semiconductor layer.

The semiconductor layer may include a second lower portion positioned on the substrate and a second upper portion positioned on the second lower portion, wherein a hydrogen content in the second lower portion may be greater than a hydrogen content in the second upper portion.

The method may further include, after the crystallizing, forming a gate electrode on the substrate.

An embodiment may be related to a display apparatus. The display apparatus may include a substrate, a gate electrode overlapping the substrate, and a semiconductor layer positioned between the substrate and the gate electrode. The semiconductor layer may include a first layer and a second layer positioned between the first layer and the gate electrode. A/the hydrogen content of the first layer is greater than a hydrogen content of the second layer.

The semiconductor layer may include polycrystalline silicon.

A grain interface of the polycrystalline silicon may be oriented in a thickness direction of the semiconductor layer.

A thickness of the semiconductor layer in a direction perpendicular to the substrate may be in a range of 450 angstroms (Å) to 500 Å.

A thickness of the first layer may be in a range of 150 Å to 170 Å.

The display apparatus may include a buffer layer arranged between the substrate and the semiconductor layer.

The display apparatus may include a light-emitting device arranged on the gate electrode and including a first electrode, a second electrode, and an emission layer positioned between the first electrode and the second electrode.

An embodiment may be related to a method for manufacturing a display apparatus. The method may include the following steps: forming an amorphous silicon layer on a substrate; heat-treating the amorphous silicon layer to form a heat-treated amorphous silicon layer; doping the heat-treated amorphous silicon layer with hydrogen to form a hydrogen-doped amorphous silicon layer; and crystallizing the hydrogen-doped amorphous silicon layer into a polycrystalline silicon layer by irradiating a laser to the hydrogen-doped amorphous silicon layer. The hydrogen-doped amorphous silicon layer may include a first portion and a second portion. The first portion may be positioned between the substrate and the second portion. A/the hydrogen content of the first portion may be greater than a/the hydrogen content of the second portion.

A deposition temperature for forming the amorphous silicon layer through deposition in the forming of the amorphous silicon layer on the substrate may be in a range of 390° C. to 490° C.

A heat treatment temperature in the heat-treating may be in a range of 440° C. to 500° C.

The heat-treating may be performed for a period in a range of 300 seconds to 360 seconds.

A/the hydrogen content of the heat-treated amorphous silicon layer may be 3 at % or less.

A dose amount of hydrogen in the doping may be in a range of $1\times10^{15}$ atom/cm$^3$ to $1\times10^{17}$ atom/cm$^3$.

An acceleration voltage in the doping may be in a range of 3 keV to 10 keV.

A thickness of the hydrogen-doped amorphous silicon layer in a direction perpendicular to the substrate may be in a range of 450 Å to 500 Å.

A thickness of the first portion in the direction perpendicular to the substrate may be in a range of 150 Å to 170 Å.

The method may include forming a semiconductor layer by patterning the polycrystalline silicon layer.

A grain interface of polycrystalline silicon included in the semiconductor layer may be oriented in a thickness direction of the semiconductor layer.

The semiconductor layer includes a first layer and a second layer. The first layer may be positioned between the substrate and the second layer. A/the hydrogen content of the first layer may be greater than a/the hydrogen content of the second layer.

The method may include the following step: after the crystallizing, forming a gate electrode that overlaps the polycrystalline silicon layer.

DETAILED DESCRIPTION

Figure 1:
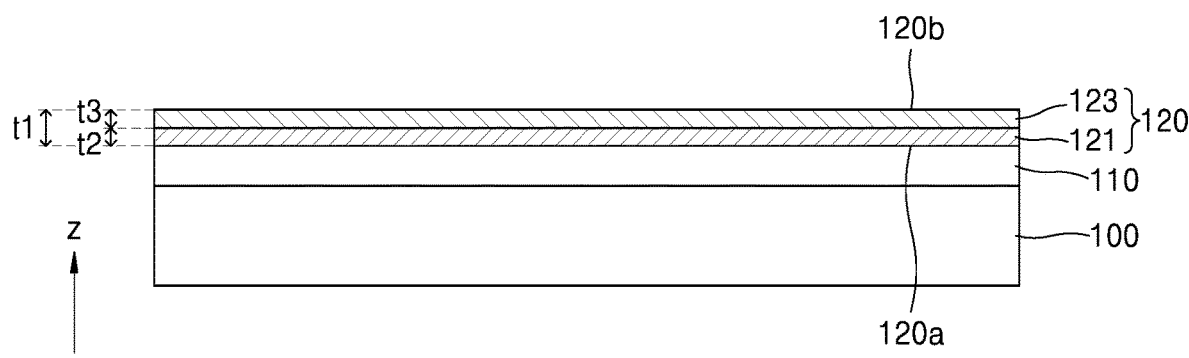
FIG. 1, FIG. 2, FIG. 3, FIG. 4, FIG. 5, and FIG. 6 are schematic cross-sectional views illustrating structures formed in a method for manufacturing a display apparatus according to an embodiment.

Examples of embodiments are described with reference to the accompanying drawings. In the drawings, like reference numerals may refer to like elements. Practical embodiments may have different forms and should not be construed as being limited to the described embodiments.

Although the terms "first," "second," etc. may be used to describe various components/elements, these components/elements should not be limited by these terms. These terms may be used to distinguish one component/element from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular forms "a," "an," and "the" may indicate the plural forms as well, unless the context clearly indicates otherwise.

The terms "includes", "comprises", "has", "including", "comprising", and/or "having" may specify the presence of stated features or elements, but may not preclude the presence or addition of one or more other features or elements.

When a first element is referred to as being "on" component second element, the first element can be directly or indirectly on the second element. Zero, one, or more intervening elements may be present between the first element and the second element.

Dimensions in the drawings may be exaggerated for convenience of explanation and may not limit embodiments.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "include" or "comprise" may mean "be made of." The term "adjacent" may mean "immediately adjacent." The expression that an element extends in a particular direction may mean that the element extends lengthwise in the particular direction and/or that the lengthwise direction of the element is in the particular direction. The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate. A thickness may be in a direction perpendicular to a substrate. A height may be with reference to a substrate. The terms "lower" and "upper" may be relative to a substrate. The expression "about A to about B" may mean "in a range of A to B."

Figure 2:
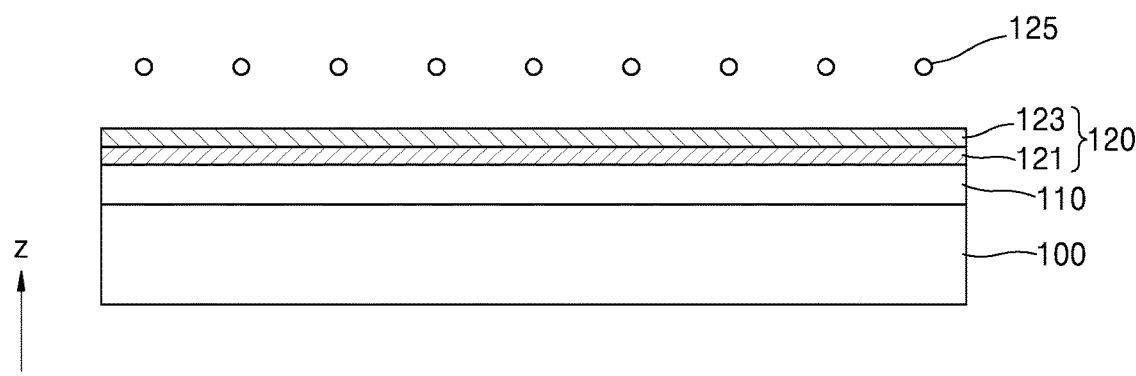
Figure 3:
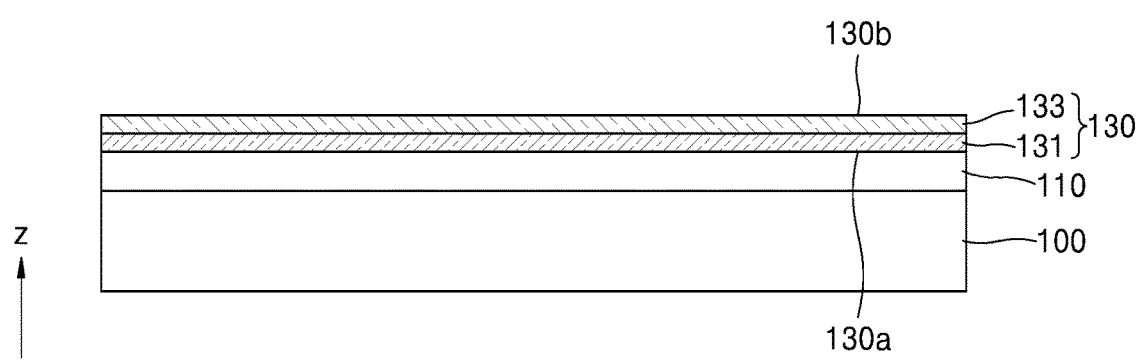
Figure 4:
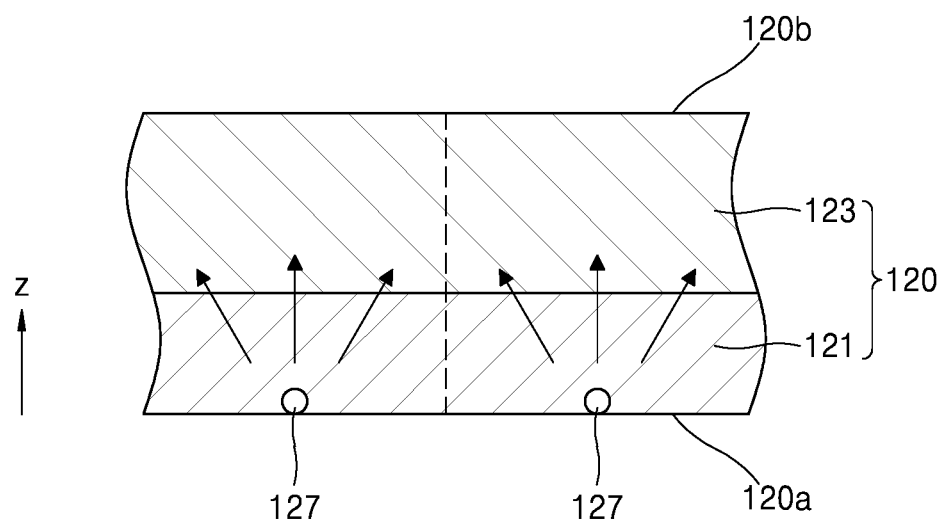

FIGS. 1 to 6 are schematic cross-sectional views illustrating structures formed in a method of manufacturing a display apparatus according to an embodiment. FIG. 4 is a view for explaining seed growth during a crystallization process.

Referring to FIG. 1, after a substrate 100 is prepared, a buffer layer 110 may be formed on the substrate 100, and an amorphous silicon layer 120 may be formed on the buffer layer 110.

The substrate 100 may include glass or a polymer resin. The polymer resin may include at least one of polyethersulfone, polyarylate, polyether imide, polyethylene naphthalate, polyethylene terephthalate, polyphenylene sulfide, polyimide, polycarbonate, cellulose triacetate, cellulose acetate propionate, and the like.

The substrate 100 may include organic material layers and inorganic material layers that are alternately stacked. For example, the substrate 100 may include a first base layer, a first barrier layer, a second base layer, and a second barrier layer, which are sequentially stacked. The first base layer and the second base layer may each include an organic material, and the first barrier layer and the second barrier layer may each include an inorganic material.

The buffer layer 110 may be formed on the substrate 100. The buffer layer 110 may prevent foreign matter, moisture, or external air from moving from the substrate 100 to the amorphous silicon layer 120. The buffer layer 110 may include an inorganic material such as silicon oxide, silicon oxynitride, or silicon nitride, and may include a single layer or multiple layers.

The amorphous silicon layer 120 may be formed on the buffer layer 110. The amorphous silicon layer 120 may include amorphous silicon. The amorphous silicon layer 120 may include a first layer 121 and a second layer 123. The first layer 121 of the amorphous silicon layer 120 may be formed on the substrate 100, and the second layer 123 may be formed on the first layer 121. The buffer layer 110 may be between the first layer 121 of the amorphous silicon layer 120 and the substrate 100.

The first layer 121 of the amorphous silicon layer 120 may refer to a lower layer (or a lower portion) of the amorphous silicon layer 120 in a thickness direction (i.e., a z direction) of the amorphous silicon layer 120, and the second layer 123 of the amorphous silicon layer 120 may refer to an upper layer (or an upper portion) of the amorphous silicon layer 120 in the thickness direction (i.e., the z direction) of the amorphous silicon layer 120.

The first layer 121 may correspond to a portion from a lower surface 120a of the amorphous silicon layer 120 to a ⅓ point in the thickness direction of the amorphous silicon layer 120, and the second layer 123 may correspond to a portion from the ⅓ point of the amorphous silicon layer 120 to an upper surface 120b of the amorphous silicon layer 120. That is, in the z direction, a thickness t2 of the first layer 121 may be ⅓ of a thickness t1 of the amorphous silicon layer 120, and a thickness t3 of the second layer 123 may be ⅔ of the thickness t1 of the amorphous silicon layer 120.

The thickness t1 of the amorphous silicon layer 120 may be about 450 angstroms (Å) to about 500 Å. If the thickness t1 of the amorphous silicon layer 120 is less than 450 Å, the thickness of a semiconductor layer 140 (see FIG. 6) manufactured using the amorphous silicon layer 120 may be too thin, such that the characteristics of a thin-film transistor TFT (see FIG. 6) including the semiconductor layer 140 may be unsatisfactory. If the thickness t1 of the amorphous silicon layer 120 exceeds 500 Å, the thickness of the semiconductor layer 140 (see FIG. 5) manufactured using the amorphous silicon layer 120 may be too thick, such that the characteristics of a thin-film transistor TFT including the semiconductor layer 140 may be unsatisfactory. Since the thickness t1 of the amorphous silicon layer 120 is about 450 Å to about 500 Å, the characteristics of the thin-film transistor TFT may be satisfactory.

The thickness t2 of the first layer 121 of the amorphous silicon layer 120 may be about ⅓ of the thickness t1 of the amorphous silicon layer 120. For example, the thickness t1 of the first layer 121 of the amorphous silicon layer 120 may be about 150 Å to about 170 Å.

If a/the hydrogen content in/of the amorphous silicon layer 120 is too high, during a crystallization process of crystallizing the amorphous silicon layer 120 into a polycrystalline silicon layer 130 (see FIG. 3), hydrogen in the amorphous silicon layer 120 may significantly explode, resulting in a substantial film breakage defect. In particular, if a/the hydrogen content in/of the second layer 123 of the amorphous silicon layer 120 is high, a significant film breakage defect may occur.

Figure 7:
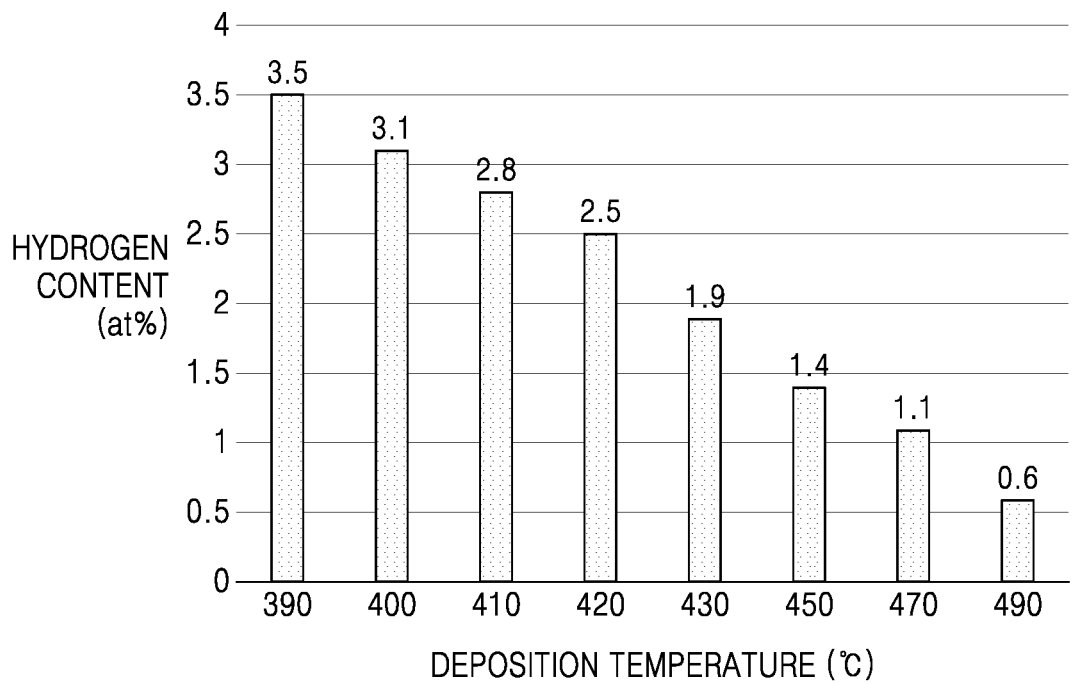
FIG. 7 is a graph showing values of a/the hydrogen content in/of an amorphous silicon layer according to deposition temperatures of the amorphous silicon layer according to one or more embodiments.

FIG. 7 is a graph showing values of a/the hydrogen content in/of an amorphous silicon layer according to deposition temperatures of the amorphous silicon layer according to one or more embodiments.

Referring to FIG. 7, when the deposition temperature of the amorphous silicon layer 120 is 390° C., the hydrogen content in the amorphous silicon layer 120 is 3.5 at %, and the hydrogen content in the amorphous silicon layer 120 decreases as the deposition temperature of the amorphous silicon layer 120 increases. As the deposition temperature of the amorphous silicon layer 120 increases, hydrogen in the amorphous silicon layer 120 is released to the outside, and thus the hydrogen content in the amorphous silicon layer 120 decreases.

When heat treatment is performed on the amorphous silicon layer 120, hydrogen contained in the amorphous silicon layer 120 may be released to the outside, and thus the hydrogen content in the amorphous silicon layer 120 may be reduced. The hydrogen content in the amorphous silicon layer 120 may be controlled by heat-treating the amorphous silicon layer 120 before the crystallization process of crystallizing the amorphous silicon layer 120 into the polycrystalline silicon layer 130. By heat-treating the amorphous silicon layer 120 before the crystallization process, the hydrogen content in the amorphous silicon layer 120 may be lowered to prevent or reduce occurrences of film breakage defects during the crystallization process.

Referring back to FIG. 1, the amorphous silicon layer 120 may be deposited on the buffer layer 110 at a temperature of about 390° C. to about 490° C. If the deposition temperature of the amorphous silicon layer 120 is less than about 390° C., the deposition temperature may be too low, and thus hydrogen in the amorphous silicon layer 120 and/or the second layer 123 may not be sufficiently released to the outside, such that the hydrogen content in the amorphous silicon layer 120 may be too high. As a result, a significant film breakage defect may occur during the crystallization process. On the other hand, if the deposition temperature of the amorphous silicon layer 120 exceeds about 490° C., the deposition temperature may be too high, and the amorphous silicon layer 120 may be damaged, such that the reliability (or characteristics) of the semiconductor layer 140 manufactured using the amorphous silicon layer 120 may be unsatisfactory. Since the amorphous silicon layer 120 is deposited at a temperature of about 390° C. to about 490° C., the hydrogen content in the amorphous silicon layer 120 may be sufficiently low, and thus damage to the amorphous silicon layer 120 may be prevented or reduced, and the characteristics of the thin-film transistor TFT including a semiconductor layer manufactured using the amorphous silicon layer 120 may be satisfactory.

A heat treatment process may be performed after a deposition process. That is, after the amorphous silicon layer 120 is deposited on the buffer layer 110, the deposited amorphous silicon layer 120 may be heat-treated. The hydrogen content in the second layer 123 of the amorphous silicon layer 120 may be reduced through the heat treatment of the amorphous silicon layer 120.

A heat treatment temperature in an operation of heat-treating the amorphous silicon layer 120 may be about 440° C. to about 500° C. If the heat treatment temperature is less than about 440° C., the heat treatment temperature may be too low, and thus hydrogen in the amorphous silicon layer 120 and/or the second layer 123 may not be sufficiently released to the outside, and thus the hydrogen content in the amorphous silicon layer 120 may be too high. As a result, a significant film breakage defect may occur during the crystallization process. On the other hand, if the heat treatment temperature exceeds about 500° C., the heat treatment temperature may be too high, and the amorphous silicon layer 120 may be damaged, and thus the reliability (or characteristics) of the semiconductor layer 140 manufactured through the amorphous silicon layer 120 may be unsatisfactory. Since the amorphous silicon layer 120 is heat-treated at a temperature of about 440° C. to about 500° C., the hydrogen content in the amorphous silicon layer 120 may be sufficiently low, and thus damage to the amorphous silicon layer 120 may be prevented or reduced, and the characteristics of the thin-film transistor TFT including the semiconductor layer manufactured using the amorphous silicon layer 120 may be satisfactory.

A heat treatment time (period) in an operation of heat-treating the amorphous silicon layer 120 may be about 300 seconds to about 360 seconds. If the heat treatment time is less than about 300 seconds, the heat treatment time may be too short, and thus hydrogen in the amorphous silicon layer 120 and/or the second layer 123 may not be released to the outside, such that the hydrogen content in the amorphous silicon layer 120 may be undesirably high. As a result, a significant film breakage defect may occur during the crystallization process. On the other hand, if the heat treatment time exceeds about 360 seconds, the heat treatment time may be too long, and thus the amorphous silicon layer 120 may be damaged, such that the reliability (or characteristics) of the semiconductor layer 140 manufactured using the amorphous silicon layer 120 may be unsatisfactory. Since the amorphous silicon layer 120 is heat-treated for a time in a range of about 300 seconds to about 360 seconds, the hydrogen content in the amorphous silicon layer 120 may be sufficiently low, and thus damage to the amorphous silicon layer 120 may be prevented or reduced, such that the characteristics of the thin-film transistor TFT including the semiconductor manufactured using the amorphous silicon layer 120 may be satisfactory.

Figure 8:
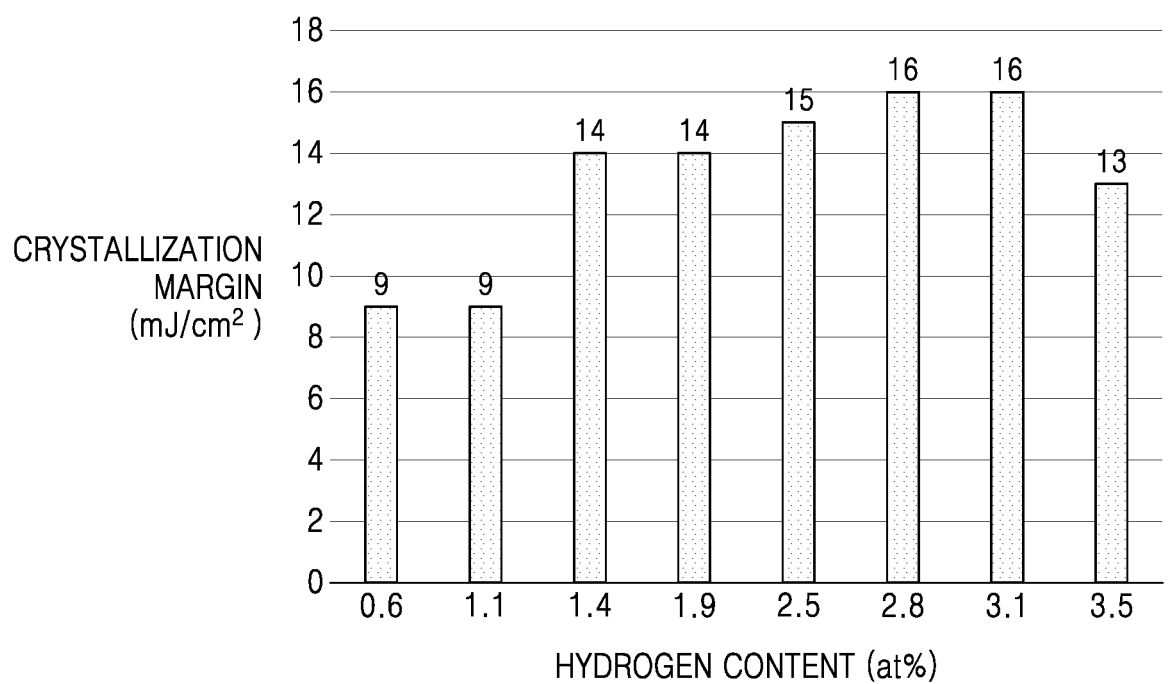
FIG. 8 is a graph showing values of a crystallization margin according to values of a/the hydrogen content in/of an amorphous silicon layer according to one or more embodiments.

FIG. 8 is a graph showing values of a crystallization margin according to values of a/the hydrogen content in/of an amorphous silicon layer according to one or more embodiments. The crystallization margin may refer to a crystallization energy region without stains.

Referring to FIG. 8, the crystallization margin of a crystallization process increases as the hydrogen content in the amorphous silicon layer 120 increases. As the hydrogen content in the amorphous silicon layer 120 increases from 1.1 at % to 3.1 at %, the crystallization margin of a crystallization process of crystallizing the amorphous silicon layer 120 into the polycrystalline silicon layer 130 (see FIG. 3) may improve.

However, when the hydrogen content in the amorphous silicon layer 120 increases from 3.1 at % to 3.5 at %, the crystallization margin of the crystallization process decreases from 16 mJ/cm$^2$ to 13 mJ/cm$^2$. Up to 3.1 at %, the higher the hydrogen content in the amorphous silicon layer 120, the higher the crystallization margin of the crystallization process. However, when the hydrogen content in the amorphous silicon layer 120 is too high, defects such as significant film breakage may occur, such that the crystallization margin of the crystallization process may decrease.

Accordingly, the hydrogen content in the amorphous silicon layer 120 after the heat treatment operation is performed should be about 3 at % or less. Specifically, the hydrogen content in the amorphous silicon layer 120 after the heat treatment step is performed may be about 2 at % to about 3 at %.

When the hydrogen content in the amorphous silicon layer 120 is too low, the crystallization margin of the crystallization process may decrease; when the hydrogen content in the amorphous silicon layer 120 is too high, a film breakage defect may occur and thus the crystallization margin may decrease. Therefore, in order to increase the crystallization margin, it is necessary to control the hydrogen content in the amorphous silicon layer 120. In particular, when the hydrogen content in the second layer 123 of the amorphous silicon layer 120 is too high, the probability of occurrence of a film breakage defect may increase, and thus it is necessary to optimize the hydrogen content in the second layer 123 of the amorphous silicon layer 120.

Referring to FIG. 2, after heat treatment is performed on the amorphous silicon layer 120, an operation of doping the amorphous silicon layer 120 with impurities 125 may be performed. The impurities 125 may be hydrogen, hydrogen ions, or the like. The impurities 125 may include boron, phosphorus, arsenic, antimony, gallium, aluminum, or the like.

When heat treatment is performed on the amorphous silicon layer 120, hydrogen in the amorphous silicon layer 120 may be released to the outside, and thus the hydrogen content in/of the amorphous silicon layer 120 may decrease. For example, both a/the hydrogen content in/of the first layer 121 of the amorphous silicon layer 120 and a/the hydrogen content in/of the second layer 123 of the amorphous silicon layer 120 may decrease. However, if the hydrogen content in the amorphous silicon layer 120 is too low, the crystallization margin of a crystallization process may decrease, and thus it is necessary to maintain sufficient hydrogen content in the amorphous silicon layer 120. If the hydrogen content in the second layer 123 of the amorphous silicon layer 120 is too high, a film breakage defect may occur in the crystallization process, and thus it is desirable to increase the hydrogen content in/of the first layer 121 of the amorphous silicon layer 120 while minimizing an increase in the hydrogen content in/of the second layer 123 of the amorphous silicon layer 120.

An operation of doping the amorphous silicon layer 120 with hydrogen may be an ion implantation process of implanting ionic hydrogen into the amorphous silicon layer 120. The second layer 123 of the amorphous silicon layer 120 may be minimally doped with hydrogen, while the first layer 121 of the amorphous silicon layer 120 may be doped (or implanted) with a large amount of hydrogen. Accordingly, the content of hydrogen included in the first layer 121 of the amorphous silicon layer 120 may be significantly greater than the content of hydrogen included in the second layer 123 of the amorphous silicon layer 120.

In the ion implantation process, ionic hydrogen may be implanted into the amorphous silicon layer 120 at an acceleration voltage in a range of about 3 keV to about 10 keV. If the acceleration voltage of the ion implantation process is less than 3 keV, a large amount of hydrogen may not reach the first layer 121 of the amorphous silicon layer 120, and thus the hydrogen content in the second layer 123 of the amorphous silicon layer 120 may undesirably increase, which may cause a film breakage defect during the crystallization process. On the other hand, if the acceleration voltage of the ion implantation process is greater than 10 keV, the acceleration voltage may be too large, and thus, hydrogen may undesirably flow into the buffer layer 110 and/or the substrate 100 arranged under the amorphous silicon layer 120. By implanting ionic hydrogen into the amorphous silicon layer 120 at an acceleration voltage in a range of about 3 keV to about 10 keV, the hydrogen content in the second layer 123 of the amorphous silicon layer 120 may be prevented from being significantly increased, and the hydrogen content in the first layer 121 of the amorphous silicon layer 120 may be sufficiently increased.

A/the dose amount of hydrogen in the ion implantation process may be about $1 \times 10^{15}$ atoms/cm$^3$ to about $1 \times 10^{17}$ atoms/cm$^3$. If the dose amount of hydrogen is less than $1 \times 10^{15}$ atoms/cm$^3$, the hydrogen content in the first layer 121 of the amorphous silicon layer 120 may be too low, and thus the crystallization margin may be unsatisfactory. On the other hand, if the dose amount of hydrogen exceeds $1 \times 10^{17}$ atoms/cm$^3$, the amount of hydrogen may be too large, such that the hydrogen content in the second layer 123 of the amorphous silicon layer 120 may be undesirably high, and such that hydrogen may flow into the buffer layer 110 and/or the substrate 100 arranged under the amorphous silicon layer 120. Since the dose amount of hydrogen in the ion implantation process is about $1 \times 10^{15}$ atom/cm$^3$ to about $1 \times 10^{17}$ atom/cm$^3$, the hydrogen content in the second layer 123 of the amorphous silicon layer 120 may be desirably low, and the hydrogen content in the first layer 121 of the amorphous silicon layer 120 may be desirably high.

When heat treatment is performed on the amorphous silicon layer 120 at the temperature and/or time according to embodiments, the hydrogen content in/of the second layer 123 of the amorphous silicon layer 120 may be reduced, and thus film breakage defects during the crystallization process may be reduced or minimized.

The hydrogen content in the first layer 121 of the amorphous silicon layer 120 may be increased by implanting (or doping) hydrogen into the amorphous silicon layer 120 using the acceleration voltage and/or dose amount according to embodiments. By increasing the hydrogen content in/of the first layer 121 of the amorphous silicon layer 120 through an ion implantation process, the crystallization margin of a crystallization process may be increased.

Referring to FIGS. 3 and 4, a crystallization process may be performed after the ion implantation process is performed. After hydrogen ions have been implanted into the amorphous silicon layer 120 to increase the hydrogen content in/of the first layer 121 of the amorphous silicon layer 120, laser may be irradiated to the amorphous silicon layer 120 to crystallize the amorphous silicon layer 120 into the polycrystalline silicon layer 130.

Referring to FIG. 4, a seed 127 may be formed on the lower surface 120a of the amorphous silicon layer 120. The seed 127 may be/include a small amount of unmelted amorphous silicon, hydrogen, or another material. The seed 127 may be/include a small amount of unmelted amorphous silicon and hydrogen are combined with each other. The seed 127 may be/include a metallic material.

After laser irradiation on the amorphous silicon layer 120, melted amorphous silicon may be solidified into polycrystalline silicon, and the polycrystalline silicon layer 130 may be formed.

The polycrystalline silicon layer 130 may include a third layer 131 and a fourth layer 133. The third layer 131 of the polycrystalline silicon layer 130 may be formed on the buffer layer 110 and/or the substrate 100, and the fourth layer 133 of the polycrystalline silicon layer 130 may be formed on the third layer 131. The buffer layer 110 may be between the third layer 131 of the polycrystalline silicon layer 130 and the substrate 100.

The third layer 131 of the polycrystalline silicon layer 130 may correspond to the first layer 121 of the amorphous silicon layer 120, and the fourth layer 133 of the polycrystalline silicon layer 130 may correspond to the second layer 123 of the amorphous silicon layer 120. The first layer 121 is crystallized to form the third layer 131. The second layer 123 is crystallized to form the fourth layer 133. The thickness of the first layer 121 may be substantially equal to the thickness of the third layer 131, and the thickness of the second layer 123 may be substantially equal to the thickness of the fourth layer 133. The third layer 131 of the polycrystalline silicon layer 130 may refer to a lower layer (or a lower portion) of the polycrystalline silicon layer 130 in a thickness direction (i.e., the z direction) of the polycrystalline silicon layer 130, and the fourth layer 133 may refer to an upper layer (or an upper portion) of the polycrystalline silicon layer 130 in the thickness direction (i.e., the z direction) of the polycrystalline silicon layer 130.

A/the hydrogen content in/of the third layer 131 of the polycrystalline silicon layer 130 may be greater than a/the hydrogen content in/of the fourth layer 133 of the polycrystalline silicon layer 130. Because hydrogen is implanted into the first layer 121 of the amorphous silicon layer 120 through an ion implantation process, the hydrogen content in/of the third layer 131 may be greater than the hydrogen content in/of the fourth layer 133. A/the hydrogen content in/of a lower surface 130a of the polycrystalline silicon layer 130 may be greater than a/the hydrogen content in/of an upper surface 130b of the polycrystalline silicon layer 130.

When a laser is irradiated to the first layer 121 of the amorphous silicon layer 120, hydrogen ions in the first layer 121 may combine with each other to form hydrogen gas, and as hydrogen ions combine with each other, energy may be radiated to the surroundings. A cooling time of the first layer 121 of the amorphous silicon layer 120 may be reduced because the energy is radiated to the surroundings, and the crystallization margin of a crystallization process may increase.

The uniformity of the generation of the seed 127 may increase as the cooling time of the melted silicon decreases. Therefore, the seed 127 may grow to form grains having a satisfactorily uniform size. The grain uniformity of the growing seed 127 may be improved due to hydrogen included in the first layer 121. The sizes of the grains in the thickness direction (i.e., the z direction) of the polycrystalline silicon layer 130 may be uniform. Accordingly, an interface between grains of polycrystalline silicon included in the polycrystalline silicon layer 130 may be formed and oriented in the thickness direction (i.e., the z direction) of the polycrystalline silicon layer 130. Advantageously, the crystallization margin of the crystallization process may increase.

Figure 5:
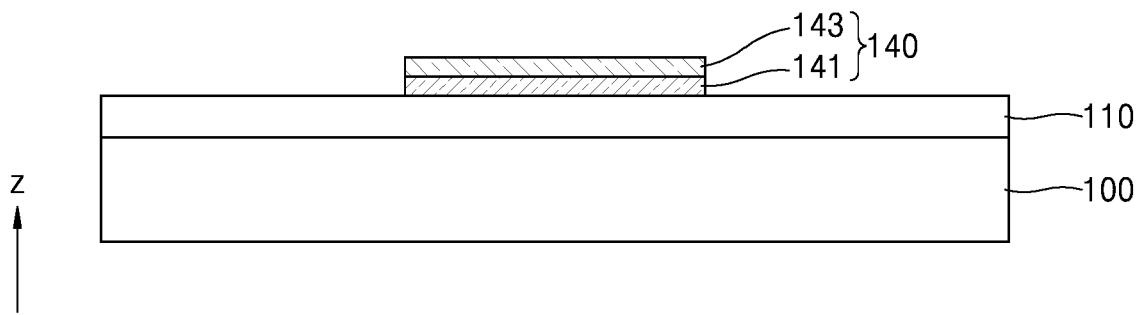

Referring to FIG. 5, after the crystallization process, the polycrystalline silicon layer 130 may be patterned to form the semiconductor layer 140. The semiconductor layer 140 may include a fifth layer 141 and a sixth layer 143. The fifth layer 141 of the semiconductor layer 140 may be formed on the buffer layer 110 and/or the substrate 100, and the sixth layer 143 of the semiconductor layer 140 may be formed on the fifth layer 141. The buffer layer 110 may be between the fifth layer 141 of the semiconductor layer 140 and the substrate 100.

The fifth layer 141 of the semiconductor layer 140 may correspond to the third layer 131 of the polycrystalline silicon layer 130, and the sixth layer 143 of the semiconductor layer 140 may correspond to the fourth layer 133 of the polycrystalline silicon layer 130. The thickness of the fifth layer 141 may be substantially equal to the thickness of the third layer 131, and the thickness of the sixth layer 143 may be substantially equal to the thickness of the fourth layer 133. The fifth layer 141 of the semiconductor layer 140 may refer to a lower layer (or a lower portion) of the semiconductor layer 140 in a thickness direction (i.e., the z-direction) of the semiconductor layer 140, and the sixth layer 143 may refer to an upper layer (or an upper portion) of the semiconductor layer 140 in the thickness direction (i.e., the z-direction) of the semiconductor layer 140.

A/the hydrogen content in/of the fifth layer 141 of the semiconductor layer 140 may be greater than a/the hydrogen content in/of the sixth layer 143 of the semiconductor layer 140. Because hydrogen is implanted into the first layer 121 of the amorphous silicon layer 120 through an ion implantation process, the hydrogen content in the fifth layer 141 may be greater than the hydrogen content in the sixth layer 143. A/the hydrogen content in/of the lower surface of the semiconductor layer 140 may be greater than a/the hydrogen content in/of the upper surface of the semiconductor layer 140.

Figure 6:
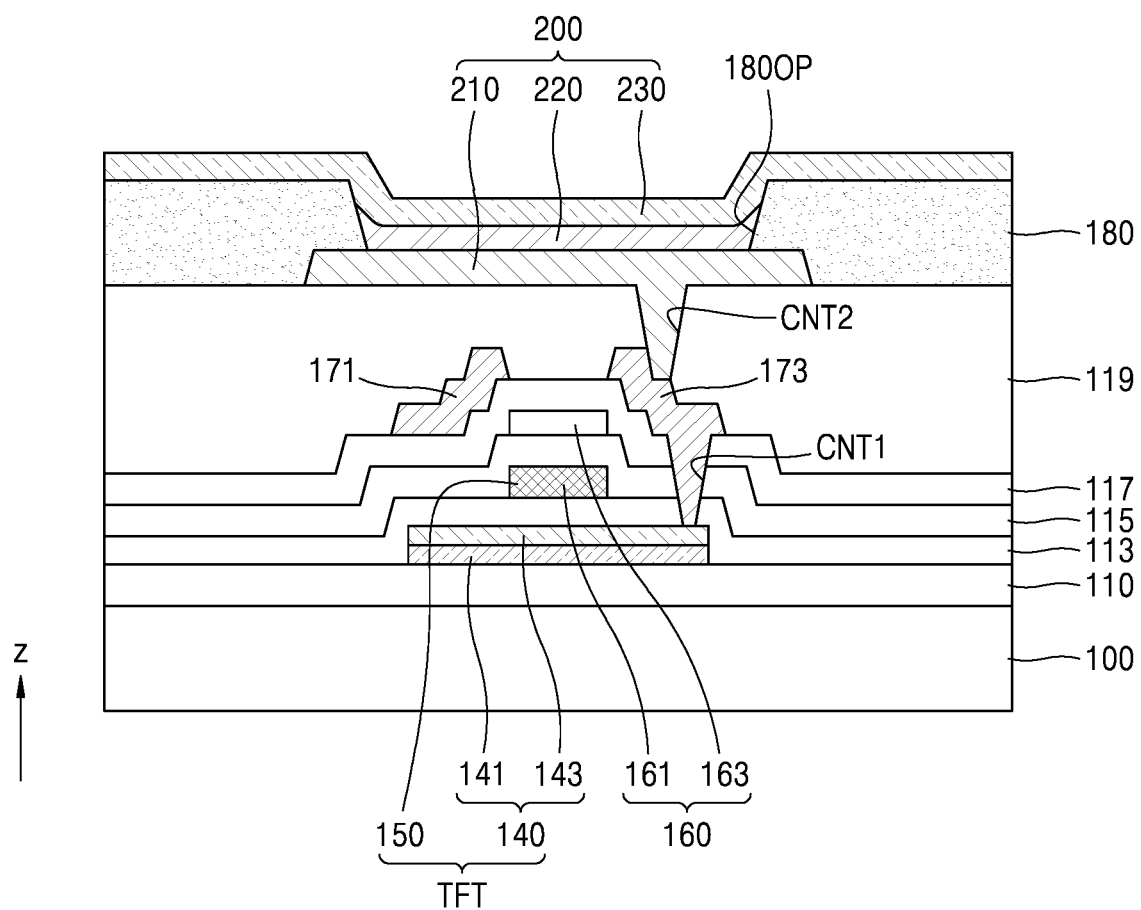

Referring to FIG. 6, a gate electrode 150, an upper electrode 163, connection electrodes 171 and 173, and a light-emitting device 200 may be sequentially formed on the semiconductor layer 140.

A first insulating layer 113 may be formed on the semiconductor layer 140. The first insulating layer 113 may cover the semiconductor layer 140. The first insulating layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), and the like. $ZnO_x$ may include zinc oxide (ZnO) and/or zinc peroxide ($ZnO_2$).

The gate electrode 150 may be formed on the first insulating layer 113. The gate electrode 150 may overlap the semiconductor layer 140. The semiconductor layer 140 may include a channel region and may a source region and a drain region on opposite sides of the channel region. The gate electrode 150 may overlap the channel region of the semiconductor layer 140. The semiconductor layer 140 and the gate electrode 150 may be insulated from each other by the first insulating layer 113. The gate electrode 150 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like, and may include a single layer or a multi-layer structure.

A thin-film transistor TFT may include the semiconductor layer 140 and the gate electrode 150.

A second insulating layer 115 may be formed on the gate electrode 150. The second insulating layer 115 may cover the gate electrode 150. The second insulating layer 115 may include at least one of $SiO_2$, $SiN_x$, SiON, $Al_2O_3$, $TiO_2$, $Ta_2O_5$, $HfO_2$, $ZnO_x$, and the like. $ZnO_x$ may include ZnO and/or $ZnO_2$.

A storage capacitor 160 may be formed on the substrate 100. The storage capacitor 160 may include a lower electrode 161 and an upper electrode 163. The lower electrode 161 may be positioned on the first insulating layer 113. The lower electrode 161 and the gate electrode 150 may include the same material and be formed on the same layer. The upper electrode 163 may be positioned on the second insulating layer 115. The second insulating layer 115 may function as a dielectric layer of the storage capacitor 160.

The upper electrode 163 may include at least one of Al, Pt, Pd, Ag, Mg, Au, Ni, Nd, Ir, Cr, Li, Ca, Mo, Ti, W, Cu, and the like, and may include a single layer or a multi-layer structure.

A third insulating layer 117 may be formed on the upper electrode 163. The third insulating layer 117 may cover the upper electrode 163. The third insulating layer 117 may include at least one of $SiO_2$, $SiN_x$, SiON, $Al_2O_3$, $TiO_2$, $Ta_2O_5$, $HfO_2$, $ZnO_x$, and the like. $ZnO_x$ may include ZnO and/or $ZnO_2$.

A first connection electrode 171 and/or a second connection electrode 173 may be formed on the third insulating layer 117. The first connection electrode 171 and the second connection electrode 173 may include the same material and be formed on the same layer. The first connection electrode 171 and the second connection electrode 173 may each include at least one of Al, Pt, Pd, Ag, Mg, Au, Ni, Nd, Ir, Cr, Li, Ca, Mo, Ti, W, Cu, and the like, and may include a single layer or a multi-layer structure. The first connection electrode 171 and the second connection electrode 173 may each include Ti—Al—Ti.

Although FIG. 6 shows that the first connection electrode 171 and the second connection electrode 173 are formed on the third insulating layer 117, the present disclosure is not limited thereto. One of the first connection electrode 171 and the second connection electrode 173 may be omitted.

At least one of the first connection electrode 171 and the second connection electrode 173 may be electrically connected to the semiconductor layer 140 through a first contact hole CNT1.

A fourth insulating layer 119 may be formed on the first connection electrode 171 and the second connection electrode 173. The fourth insulating layer 119 may include a polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, and/or a vinyl alcohol-based polymer.

The light-emitting device 200 may be formed on the fourth insulating layer 119. The light-emitting device 200 may include a first electrode 210, an emission layer 220, and a second electrode 230, which are sequentially stacked. The first electrode 210 may be an anode, and the second electrode 230 may be a cathode.

The first electrode 210 may be formed on the fourth insulating layer 119. The first electrode 210 may be connected to at least one of the first connection electrode 171 and the second connection electrode 173 through a second contact hole CNT2 defined in the fourth insulating layer 119, such that the light-emitting device 200 may be connected to the thin-film transistor TFT.

The first electrode 210 may be a (semi)transmissive electrode or a reflective electrode. The first electrode 210 may include a reflective layer including Ag, Mg, Al, Pt, Pd, Au, Ni, Nd, Ir, and/or Cr, and may include a transparent or translucent electrode layer formed on the reflective layer. The transparent or translucent electrode layer may include at least of indium tin oxide (ITO), indium zinc oxide (IZO), zinc oxide (ZnO), indium oxide ($In_2O_3$), indium gallium oxide (IGO), and aluminum zinc oxide (AZO). The first electrode 210 may have a stacked structure of ITO-Ag-ITO.

A pixel-defining layer 180 having an opening 1800P exposing at least a portion of the first electrode 210 may be formed on the first electrode 210. The opening 1800P defined in the pixel-defining layer 180 may define a light-emitting region of light emitted from the light-emitting device 200. The size/width of the opening 1800P may correspond to the size/width of the light-emitting region.

The pixel-defining layer 180 may increase a distance between the edge of the first electrode 210 and the second electrode 230, thereby preventing an arc at the edge of the first electrode 210 from occurring. The pixel-defining layer 180 may include one or more organic insulating materials, such as one or more of polyimide, polyamide, acrylic resin, benzocyclobutene, and phenol resin, and may be formed by spin coating or the like.

The emission layer 220 may be formed on the first electrode 210. The emission layer 220 may be formed in the opening 1800P defined in the pixel-defining layer 180. The emission layer 220 may include a high molecular weight organic material or a low molecular weight organic material that emits light of a certain color. The emission layer 220 may include an inorganic light-emitting material or quantum dots.

The second electrode 230 may be formed on the emission layer 220. The second electrode 230 may overlap the first electrode 210. The second electrode 230 may include a conductive material having a low work function. The second electrode 230 may include a (semi)transparent layer including Ag, Mg, Al, Pt, Pd, Au, Ni, Nd, Ir, Cr, Li, Ca, or an alloy of some of the above metals. The second electrode 230 may further include a layer including ITO, IZO, ZnO, or $In_2O_3$ on the (semi)transparent layer. The second electrode 230 may cover an entire face of the substrate 100.

Although not shown in the drawings, a first functional layer may be formed between the emission layer 220 and the first electrode 210, and a second functional layer may be formed between the emission layer 220 and the second electrode 230. The first functional layer may include a hole transport layer (HTL) and/or a hole injection layer (HIL). The second functional layer may include an electron transport layer (ETL) and/or an electron injection layer (EIL). The first functional layer and the second functional layer may be selectively arranged above and below the emission layer 220. The first functional layer and/or the second functional layer may cover an entire face of the substrate 100.

Although not shown in the drawings, an encapsulation member may be formed on the light-emitting device 200. For example, a thin-film encapsulation layer or an encapsulation substrate may be formed on the light-emitting device 200. The thin-film encapsulation layer may include at least one inorganic layer and at least one organic layer.

Figure 9:
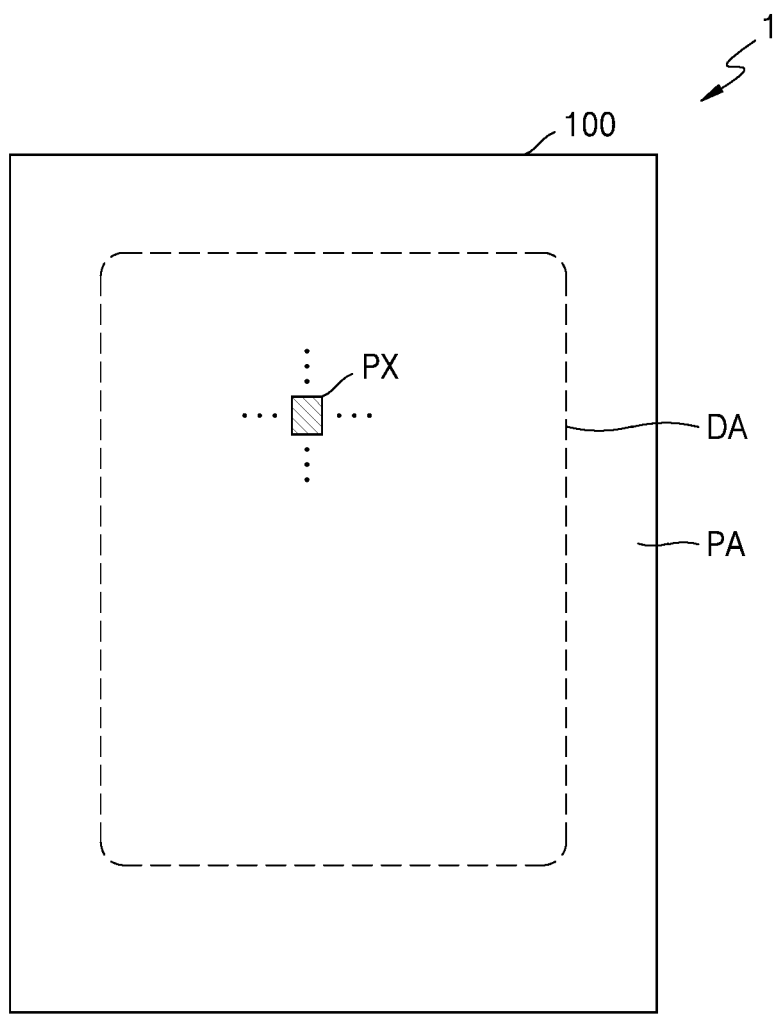
FIG. 9 is a schematic plan view of a display apparatus according to an embodiment.
Figure 10:
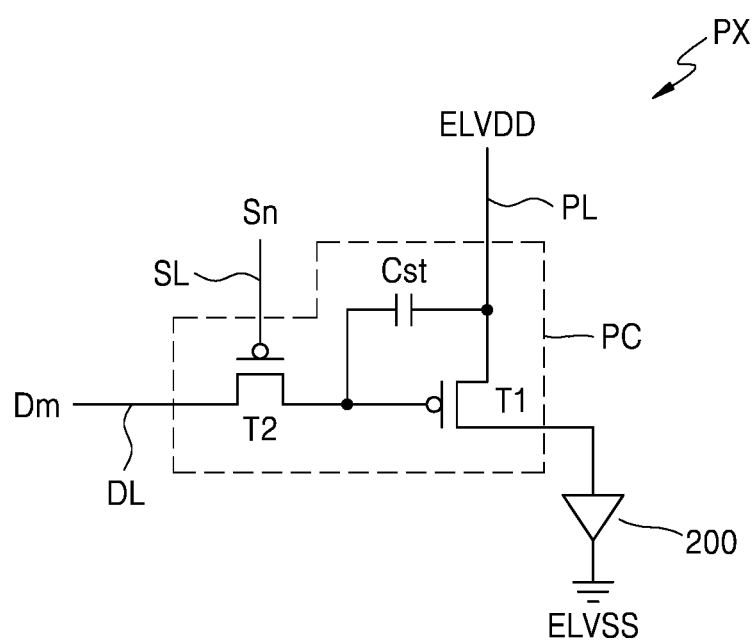
FIG. 10 is an equivalent circuit diagram of a pixel of a display apparatus according to an embodiment.

FIG. 9 is a schematic plan view of a display apparatus 1 according to an embodiment, and FIG. 10 is an equivalent circuit diagram of a pixel PX of the display apparatus 1 according to an embodiment.

Referring to FIGS. 9 and 10, the display apparatus 1 may include a display area DA for displaying images and may include a peripheral area PA outside the display area DA. The display apparatus 1 may display images using light emitted from pixels PX positioned in the display area DA.

A substrate 100 may include glass, metal, plastic, or the like. The substrate 100 may include a flexible material and may be warped, bent, folded, or rolled. The flexible material may include ultra-thin glass, metal, or plastic.

Each pixel PX may include a display element, such as an organic light-emitting diode. The pixels PX may be arranged in one or more of a stripe configuration, a PENTILE™ configuration, a mosaic configuration, and the like to display images.

The display area DA may have a rectangular shape (as shown in FIG. 9), a polygonal shape (such as a triangle, a pentagon, and/or a hexagon), a circular shape, an elliptical shape, and/or an irregular shape.

The peripheral area PA may not display images according to input signals. Wirings or pads may be arranged in the peripheral area PA. The wirings may transfer electric signals to the display area DA. A printed circuit board or a driver integrated circuit (IC) chip may be attached to the pads.

Referring to FIG. 10, a pixel PX may include a pixel circuit PC and a light-emitting device 200 (shown in FIG. 6) connected to the pixel circuit PC. The pixel circuit PC may be connected to a scan line SL and a data line DL. Referring to FIG. 6, the light-emitting device 200 may include a first electrode 210, an emission layer 220, and a second electrode 230. The second electrode 230 may receive a second driving voltage ELVSS.

The pixel circuit PC may include a first transistor T1, a second transistor T2, and a storage capacitor Cst. The first transistor T1 may be a driving transistor in which the amount of a drain current is determined according to a gate-source voltage. The second transistor T2 may be a switching transistor turned on/off according to a gate-source voltage, substantially a gate voltage. The first transistor T1 and the second transistor T2 may each be a thin-film transistor. The thin-film transistor TFT described with reference to FIG. 6 may be/represent at least one of the first transistor T1 and the second transistor T2.

The storage capacitor Cst may be connected between a power line PL and a gate of the first transistor T1. The storage capacitor Cst may include an upper electrode and a lower electrode, the upper electrode being connected to the power line PL, and the lower electrode being connected to the gate of the first transistor T1. The storage capacitor Cst may store a voltage corresponding to a difference between a voltage transferred from the second transistor T2 and a first driving voltage ELVDD supplied to the power line PL.

The first transistor T1 may control the magnitude of a current flowing from the power line PL to the light-emitting device 200 according to a gate-source voltage. The light-emitting device 200 may emit light having brightness according to a driving current. The first transistor T1 may include the gate, a drain, and a source, the gate being connected to the lower electrode of the storage capacitor Cst, the source being connected to the power line PL, and the drain being connected to the light-emitting device 200.

The second transistor T2 may transfer a data voltage Dm to the gate of the first transistor T1 according to a scan signal Sn. The second transistor T2 may include a gate, a drain, and a source, the gate being connected to the scan line SL, the source being connected to the data line DL, and the drain being connected to the gate of the first transistor T1 and to the storage capacitor Cst.

FIG. 10 shows that the pixel circuit PC includes two transistors and one storage capacitor. The pixel circuit PC may include three or more transistors and/or two or more storage capacitors. The pixel circuit PC may include seven transistors and one storage capacitor. The pixel circuit PC may have nine transistors and two storage capacitors.

The display apparatus 1 may be manufactured according to the method described with reference to FIGS. 1 to 5 and may correspond to FIG. 6.

According to embodiments, a display apparatus may include silicon layers with minimum defects.

The described embodiments should be considered in an illustrative sense and not for purposes of limitation. Descriptions of features or aspects within each embodiment should typically be considered as available for other similar features or aspects in other embodiments. While one or more embodiments have been described with reference to the figures, various changes in form and details may be made in the described embodiments without departing from the scope defined by the following claims.

What is claimed is:

1. A method for manufacturing a display apparatus, the method comprising:
  forming an amorphous silicon layer on a substrate;
  heat-treating the amorphous silicon layer to form a heat-treated amorphous silicon layer;
  doping the heat-treated amorphous silicon layer with hydrogen to form a hydrogen-doped amorphous silicon layer; and
  crystallizing the hydrogen-doped amorphous silicon layer into a polycrystalline silicon layer by irradiating a laser to the hydrogen-doped amorphous silicon layer,
  wherein the hydrogen-doped amorphous silicon layer includes a first portion and a second portion,
  wherein the first portion is positioned between the substrate and the second portion, and
  wherein a hydrogen content of the first portion is greater than a hydrogen content of the second portion.

2. The method of claim 1, wherein
  a deposition temperature for forming the amorphous silicon layer through deposition in the forming of the amorphous silicon layer on the substrate is in a range of 390° C. to 490° C.

3. The method of claim 1, wherein
  a heat treatment temperature in the heat-treating is in a range of 440° C. to 500° C.

4. The method of claim 1, wherein
  the heat-treating is performed for a period in a range of 300 seconds to 360 seconds.

5. The method of claim 1, wherein
  a hydrogen content of the heat-treated amorphous silicon layer is 3 at % or less.

6. The method of claim 1, wherein
  a dose amount of hydrogen in the doping is in a range of $1 \times 10^{15}$ atom/cm$^3$ to $1 \times 10^{17}$ atom/cm$^3$.

7. The method of claim 1, wherein
  an acceleration voltage in the doping is in a range of 3 keV to 10 keV.

8. The method of claim 1, wherein
  a thickness of the hydrogen-doped amorphous silicon layer in a direction perpendicular to the substrate is in a range of 450 Å to 500 Å.

9. The method of claim 8, wherein
  a thickness of the first portion in the direction perpendicular to the substrate is in a range of 150 Å to 170 Å.

10. The method of claim 1, further comprising:
  forming a semiconductor layer by patterning the polycrystalline silicon layer.

11. The method of claim 10, wherein
  a grain interface of polycrystalline silicon included in the semiconductor layer is oriented in a thickness direction of the semiconductor layer.

12. The method of claim 10, wherein the semiconductor layer includes a first layer and a second layer,
  wherein the first layer is positioned between the substrate and the second layer, and
  wherein a hydrogen content of the first layer is greater than a hydrogen content of the second layer.

13. The method of claim 1, further comprising:
  after the crystallizing, forming a gate electrode that overlaps the polycrystalline silicon layer.

* * * * *